(12) United States Patent
Yoskovits et al.

(10) Patent No.: US 11,704,027 B2
(45) Date of Patent: Jul. 18, 2023

(54) OPTIMIZING RECOVERY OF RECURRENT BLOCKS USING BLOOM FILTER

(71) Applicant: Western Digital Technologies, Inc., San Jose, CA (US)

(72) Inventors: Yuval Yoskovits, Beer Sheva (IL); Yan Dumchin, Beer Sheva (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/454,711

(22) Filed: Nov. 12, 2021

(65) Prior Publication Data
US 2023/0155608 A1    May 18, 2023

(51) Int. Cl.
*G06F 3/06* (2006.01)
*H03M 13/11* (2006.01)
*G11C 29/00* (2006.01)

(52) U.S. Cl.
CPC .......... *G06F 3/0619* (2013.01); *G06F 3/0659* (2013.01); *G06F 3/0679* (2013.01); *H03M 13/1108* (2013.01); *H03M 13/1177* (2013.01); *G11C 29/81* (2013.01)

(58) Field of Classification Search
CPC ........... H03M 13/1108; H03M 13/1177; G06F 3/0619; G06F 3/0659; G06F 3/0679; G11C 29/81
See application file for complete search history.

(56) References Cited

U.S. PATENT DOCUMENTS

| | | | | |
|---|---|---|---|---|
| 8,429,498 B1* | 4/2013 | Anholt | ............... | G06F 11/1048 714/764 |
| 9,164,832 B2* | 10/2015 | Gaertner | ............. | G06F 11/1048 |
| 9,524,235 B1* | 12/2016 | Sprouse | .................... | G06F 3/06 |
| 9,886,340 B2* | 2/2018 | Ahn | ...................... | G06F 3/0619 |
| 10,216,571 B2 | 2/2019 | Franca-Neto | | |
| 10,275,541 B2 | 4/2019 | Sharifi Tehrani et al. | | |
| 11,327,836 B1* | 5/2022 | Wu | ..................... | G06F 11/1068 |
| 2002/0199152 A1* | 12/2002 | Garney | ................. | G11C 29/44 714/765 |
| 2009/0144598 A1* | 6/2009 | Yoon | ................... | G06F 11/1048 714/752 |
| 2015/0363265 A1* | 12/2015 | Liu | ...................... | H03M 13/116 714/764 |

(Continued)

OTHER PUBLICATIONS

Q. Xia and W. Xiao, "Improving MLC Flash Performance with Workload-Aware Differentiated ECC," 2016 IEEE 22nd International Conference on Parallel and Distributed Systems (ICPADS), Wuhan, China, 2016, pp. 545-552.*

(Continued)

*Primary Examiner* — Steve N Nguyen
(74) *Attorney, Agent, or Firm* — Patterson + Sheridan, LLP; Steven H. VerSteeg

(57) ABSTRACT

A data storage device includes a memory device and a controller coupled to the memory device. The controller is configured to decode data from the memory device, store a decoder level for the decoded data in a bloom filter, receive a read command for the data, and decode the data using a decoder associated with the stored decoder level. The decoder level corresponds to a decoder having a certain decoding strength. The decoder level is stored in the bloom filter as an ID, where a bloom filter may be associated with each decoder level.

16 Claims, 5 Drawing Sheets

(56) References Cited

U.S. PATENT DOCUMENTS

| | | | |
|---|---|---|---|
| 2015/0373753 A1* | 12/2015 | Turon | H04L 63/166 |
| | | | 370/254 |
| 2016/0188405 A1* | 6/2016 | Li | G11C 11/5628 |
| | | | 714/755 |
| 2016/0371014 A1* | 12/2016 | Roberts | G06F 3/0688 |
| 2018/0181314 A1* | 6/2018 | Dhuse | G06F 3/067 |
| 2020/0117372 A1* | 4/2020 | Corey | G06F 3/0653 |
| 2022/0005540 A1* | 1/2022 | Kim | G11C 29/42 |

OTHER PUBLICATIONS

Xia et al. "Improving MLC Flash Performance with Workload-Aware Differentiated ECC," 2016 IEEE 22nd International Conference on Parallel and Distributed Systems, pp. 545-552, DOI 10.1109/ICPADS.2016.76.

* cited by examiner

OPTIMIZING RECOVERY OF RECURRENT BLOCKS USING BLOOM FILTER

BACKGROUND OF THE DISCLOSURE

Field of the Disclosure

Embodiments of the present disclosure generally relate to data storage devices, such as solid state drives (SSDs), and, more specifically, decoding operations of the data storage device.

Description of the Related Art

Data storage devices includes memory devices, such as non-volatile memory (NVM), in which data may be programmed to and read from the NVM. When a host device sends a write command to the data storage device, the data of the write command may be stored in the NVM. Likewise, when the host device sends a read command to the data storage device, the data associated with the read command may be read from the NVM and returned to the host device.

In order to improve reliability of the data stored in the NVM, as well as other memory devices, data programmed to the NVM may be encoded, such that the data may be protected against failure. For example, the data may be programmed with error correcting code (ECC) data, low-density parity-check (LDPC) code, and the like. However, before the encoded data may be returned to the host device, the encoded data needs to be decoded. The encoded data may be decoded by a decoder, where the process of decoding data may be time intensive and may require multiple decoding. For example, when a first decoding fails, the next decoding stage is utilized to decode the encoded data. Each subsequent decoding stage has a higher decoding capability or strength, but requires more time to decode. Therefore, each time the same encoded data is read from the NVM, the encoded data will need to be go through each decoding stage again.

Therefore, there is a need in the art for an improved decoding operation.

SUMMARY OF THE DISCLOSURE

The present disclosure generally relates to data storage devices, such as solid state drives (SSDs), and, more specifically, decoding operations of the data storage device. A data storage device includes a memory device and a controller coupled to the memory device. The controller is configured to decode data from the memory device, store a decoder level for the decoded data in a bloom filter, receive a read command for the data, and decode the data using a decoder associated with the stored decoder level. The decoder level corresponds to a decoder having a certain decoding strength. The decoder level is stored in the bloom filter as an ID, where a bloom filter may be associated with each decoder level.

In one embodiment, a data storage device includes a memory device and a controller coupled to the memory device. The controller is configured to decode data from the memory device, store a decoder level for the decoded data in a bloom filter, receive a read command for the data, and decode the data using a decoder associated with the stored decoder level.

In another embodiment, a data storage device includes a memory device and a controller coupled to the memory device. The controller is configured to receive read data from the memory device, search one or more bloom filters for an ID associated with the read data, and decode the read data based on the ID, where the ID corresponds to a decoder level of a plurality of decoder levels.

In another embodiment, a data storage device includes memory means and a controller coupled to the memory means. The controller is configured to detect that received read data has been decoded previously, use a bloom filter to determine a decoder level that the received read data has been successfully decoded based on the detecting, and decode the received read data using the determined decoder level.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to data storage devices, such as solid state drives (SSDs), and, more specifically, decoding operations of the data storage device. A data storage device includes a memory device and a controller coupled to the memory device. The controller is configured to decode data from the memory device, store a decoder level for the decoded data in a bloom filter, receive a read command for the data, and decode the data using a decoder associated with the stored decoder level. The decoder level corresponds to a decoder having a certain decoding strength. The decoder level is stored in the bloom filter as an ID, where a bloom filter may be associated with each decoder level.

Figure 1:
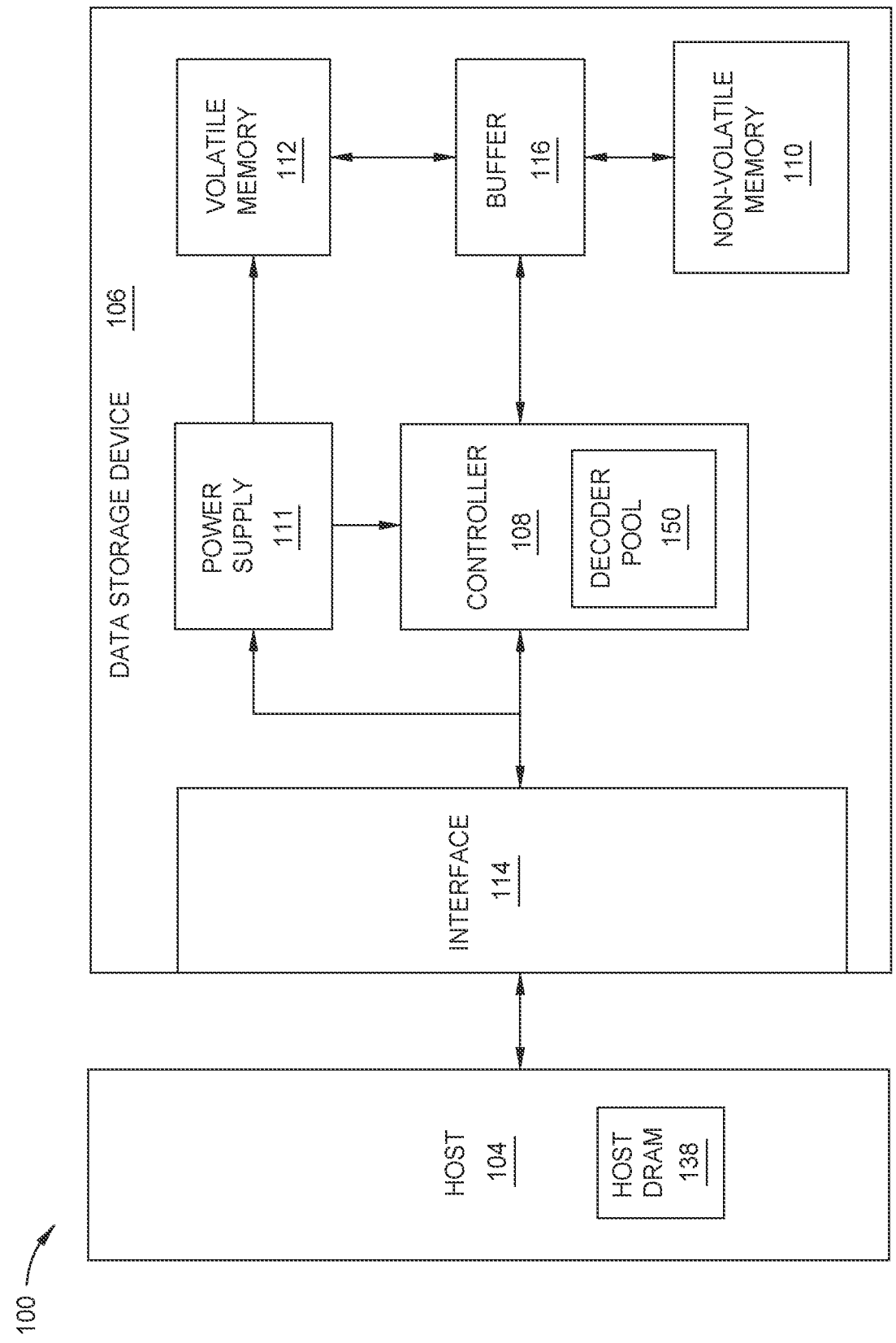
FIG. 1 is a schematic block diagram illustrating a storage system in which a data storage device may function as a storage device for a host device, according to certain embodiments.

FIG. 1 is a schematic block diagram illustrating a storage system 100 in which a host device 104 is in communication with a data storage device 106, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network-attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106 or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered or plugged into a connector) to a motherboard of the host device 104.

Interface 114 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. Interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR-based flash memory devices and may store data based on a charge contained in a floating gate of a transistor for each flash memory cell. In NVM flash memory devices, the flash memory device may be divided into a plurality of dies, where each die of the plurality of dies includes a plurality of physical or logical blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, controller 108 may use volatile memory 112 as a cache. For instance, controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

Controller 108 may manage one or more operations of the data storage device 106. For instance, controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

The controller 108 includes a decoder pool 150. The decoder pool 150 may be part of a low-density parity-check (LDPC) engine of the controller 108. The decoder pool 150 may include one or more decoders, where each of the one or more decoders have one or more gears. Each of the one or more gears may either be a tier 1 decoder, a tier 2 decoder, or a tier 3 decoder. The decoder tiers may be grouped as decoder groups, such that a tier 1 decoder group includes only tier 1 decoders, a tier 2 decoder group only includes tier 2 decoder, and a tier 3 decoder only includes tier 3 decoders. The exemplification of the different tiers of decoders is not intended to be limiting, but to provide an example of a possible embodiment. For example, the usage of the term "tier" may be utilized as a placeholder for different decoders specialized for different cases. Furthermore, more than or less than the exemplified tiers of decoders are contemplated.

The tier 1 decoder may be utilized for less intensive decoding tasks, such as for low bit error rate (BER) codewords and the tier 2 decoder and the tier 3 decoder may be utilized for more intensive decoding tasks, such as for higher BER codewords. In other embodiments, the selected decoder may be based on whether the receive codeword exceeds some certain syndrome weight threshold of the tier 1 decoder, the tier 2 decoder, or the tier 3 decoder. The decoder utilized may be dependent on the decoding operation as well as the current resources utilized, such as current power consumption by the other components of the data storage device. The various decoders may use a tradeoff between latency and power to correction capability, such that the tradeoff is a gear shifting scheme. For example, the tier 1 decoder may be a bit flipping decoder, while the tier 2 and the tier 3 decoders may be message passing decoders. In this context, a tier 2 decoder may be a faster message passing decoder when compared to a tier 3 decoder and the tier 3 decoder may be a stronger message passing decoder when compared to the tier 2 decoder.

Figure 2:
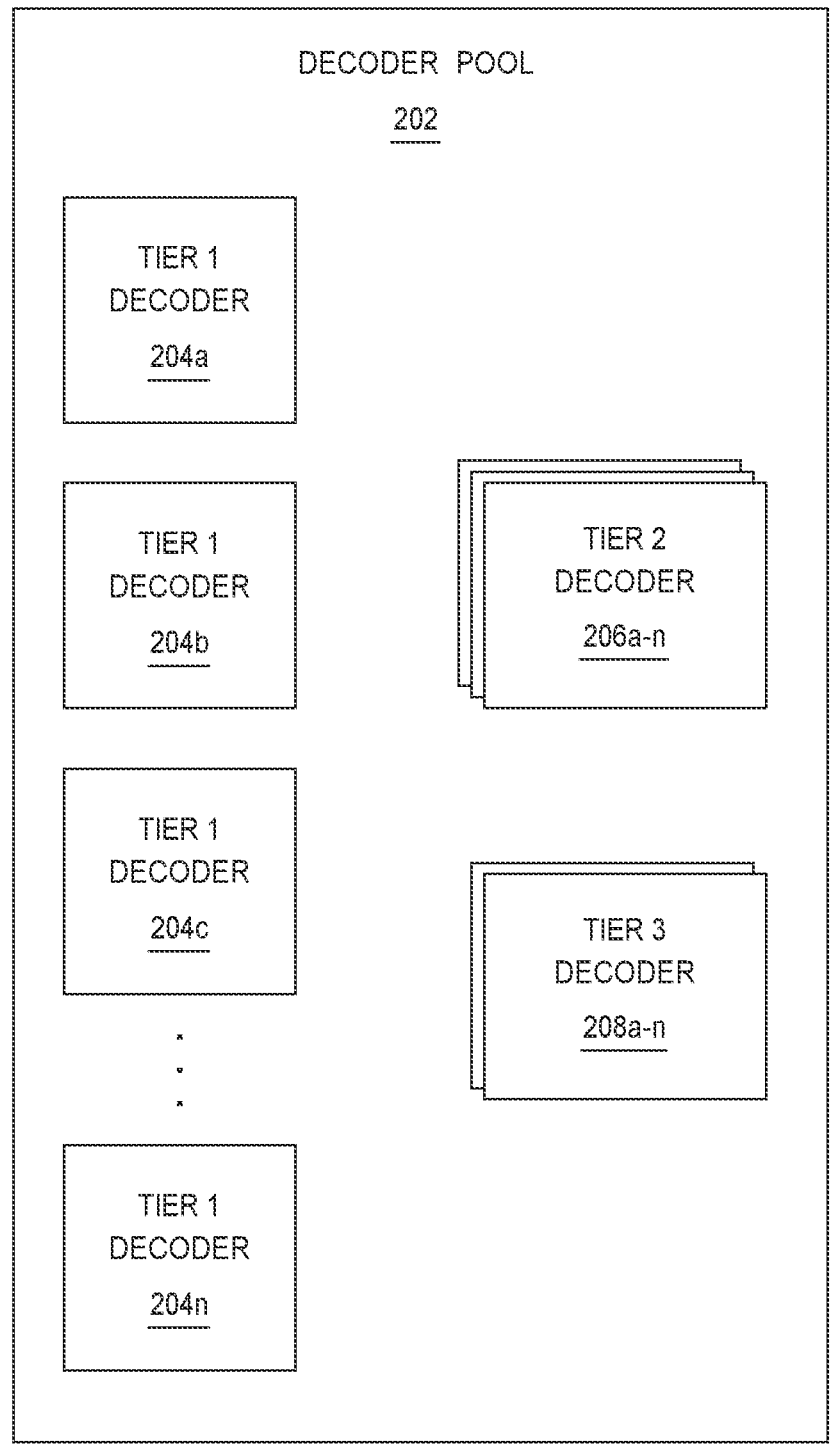
FIG. 2 is an illustration of a decoder pool architecture, according to certain embodiments.

FIG. 2 is a schematic block diagram illustrating a decoder pool architecture 200, according to disclosed embodiments. The decoder pool architecture 200 may be part of the decoder pool 150 of FIG. 1. In certain approaches, a codeword provided to a decoder pool may be provided first to a low order decoder (e.g., tier 1 decoder). However, if the low order decoder fails, such as when the codeword has a failed bit count (FBC) greater than a threshold FBC of the low order decoder, then the codeword is sent to a decoder of a higher order (e.g., tier 2 decoder and/or tier 3 decoder).

Furthermore, the plurality of decoders of the decoder pool architecture 200 may be divided into groups of independent decoders. For example, a first decoder group may include only tier 1 decoders, a second decoder group may only include tier 2 decoders, and a third decoder group may only include tier 3 decoders. In one example, if a codeword using a tier 3 decoder has a long decode latency, then a controller, such as the controller 108 of FIG. 1, may still use the tier 1 decoders and the tier 2 decoders for other codeword decoding operations.

The decoder pool architecture 200 includes a plurality of tier 1 decoders 204a-204n, a plurality of tier 2 decoders 206a-206n, and a plurality of tier 3 decoders 208a-208n. In some embodiments, the number of tier 1 decoders is greater than the number of tier 2 decoders and the number of tier 2 decoders is greater than the number of tier 3 decoders. In other embodiments, each tier of decoders only includes one decoder. In yet other embodiments, each tier of decoders includes one or more decoders.

Furthermore, the controller 108 may be configured to determine which decoder of the plurality of decoders 204a-204n, 206a-206n, 208a-208n will decode a received codeword. The received codeword may be from volatile memory, such as the volatile memory 112 of FIG. 1, or from the NVM, such as the NVM 110 of FIG. 1. For example, if the controller 108 determines that the received codeword includes a high BER, then the received codeword may be decoded by one of the plurality of tier 3 decoders 208a-208n, rather than one of the plurality of tier 1 decoders 204a-204n or one of the plurality of tier 2 decoders 206a-206n.

Figure 3:
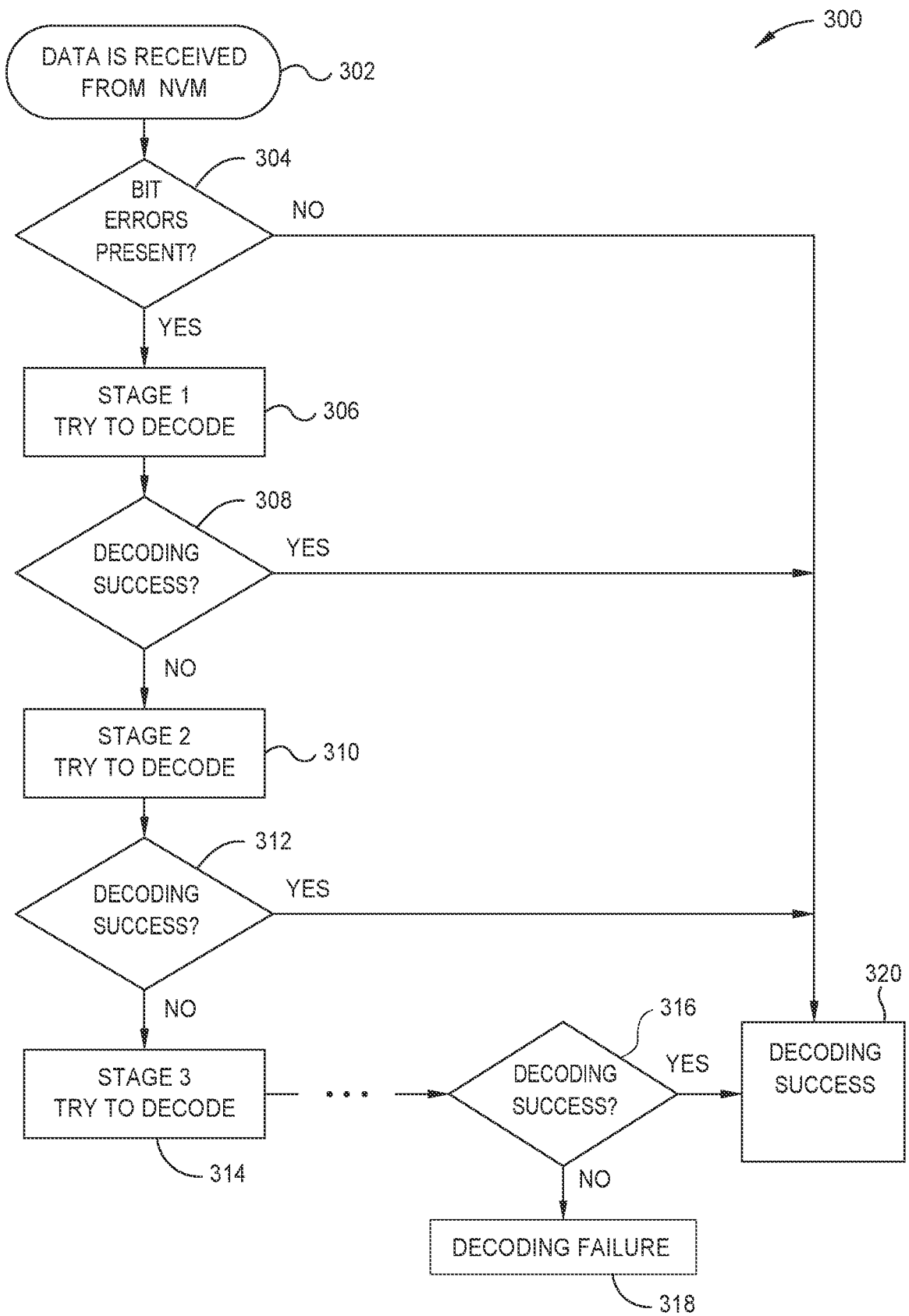
FIG. 3 is a flow diagram illustrating a method of decoding, according to certain embodiments.

FIG. 3 is a flow diagram illustrating a method 300 of decoding, according to certain embodiments. Aspects of the storage system 100 of FIG. 1 may be referenced herein for exemplary purposes. Method 300 may be implemented by the controller 108.

At block 302, the controller 108 receives data from the NVM 110. For example, the controller 108 may retrieve data from the NVM 110 in response to a read command received from the host device 104 or as part of a data management operation, such as garbage collection, of the data storage device 106. The data in the NVM 110 is stored as encoded data. At block 304, the controller 108 determines if there are bit errors present. For example, the encoded data may include cyclic redundancy check (CRC) code, where the controller 108 utilizes the CRC code to determine if there any bit errors present. In one example, a decoder may decode the encoded data using the CRC to determine the amount of bit errors present.

If there are no bit errors present (e.g., the syndrome weight equals 0) at block 304, then the controller 108 returns the decoded data to the host device 104 with a completion message at block 320. However, if there are bit errors present at block 304, then the controller 108 sends the retrieved data to a stage 1 decoding decoder at block 306.

When the data with bit errors is retrieved from the NVM 110, the retrieved data is sent to a decoder of the decoder pool 150. Because the controller 108 may not know the characteristics of the data, such as the bit error rate (BER) or the failed bit count (FBC), retrieved from the NVM, a lower powered decoder, such as a decoder of the plurality of tier 1 decoders 204a-204n, may be used to decode the retrieved data. In the description herein, each decoding stage may be associated with a decoder tier. For example, a stage 1 decoding may be associated with a decoder of the plurality of tier 1 decoders 204a-204n, a stage 2 decoding may be associated with a decoder of the plurality of tier 2 decoders 206a-206n, and so-forth. It is to be understood that the embodiments described herein are not limited to the described number of decoding stages and other amounts of decoding stages are contemplated. Furthermore, each higher stage decoder may require additional time and resources, but has a higher correction capability than the previous stage decoders.

At block 308, the controller 108 determines if the stage 1 decoding was successful. If the stage 1 decoding was successful at block 308, then the controller 108 returns the decoded data to the host device 104 with a completion message at block 320. However, if the stage 1 decoding was not successful at block 308, then the controller 108 attempts to decode the data using a stage 2 decoding decoder at block 310.

At block 312, the controller 108 determines if the stage 2 decoding was successful. If the stage 2 decoding was successful at block 312, then the controller 108 returns the decoded data to the host device 104 with a completion message at block 320. However, if the stage 2 decoding was not successful at block 312, then the controller 108 attempts to decode the data using a stage 3 decoding decoder at block 314.

Method 300 iterates through the plurality of higher stage decoders until either there are no more higher stage decoders or until a threshold limit, which may be related to a timeout limit or the like, is reached. At block 316, the controller 108 determines if the decoding was successful. Because a threshold limit of decoding attempts or time for decoding may be reached, the controller 108 returns a decoding failure message to the host device 104 at block 318. If the decoding was successful at block 316, then the controller 108 returns the decoded data to the host device 104 with a completion message at block 320.

Figure 4:
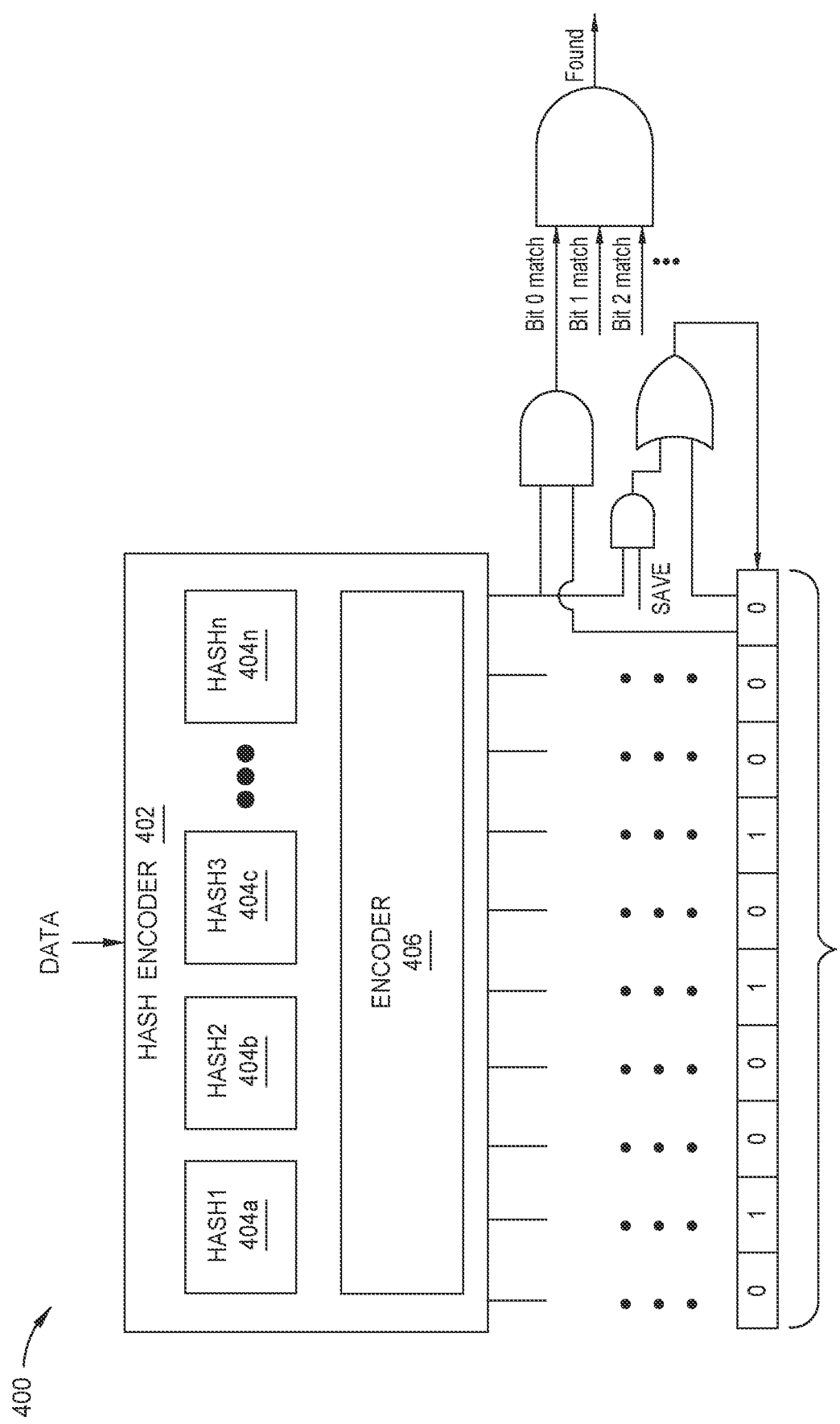
FIG. 4 is an illustration of an example of a bloom filter implementation, according to certain embodiments.

FIG. 4 is an illustration of an example 400 of a bloom filter implementation, according to certain embodiments. Aspects of the storage system 100 of FIG. 1 may be referenced herein for exemplary purposes. The example 400 of the bloom filter implementation may be located in the controller 108. When the bloom filter is initialized, a bit array 408 is initialized to zeros. Data is received at a hash encoder 402. The hash encoder 402 includes the plurality of hashes 404a-404n and an encoder 406. During a "save" operation, the plurality of hashes 404a-404n determine which bits in the bit array 408 should be updated to a "1". The encoder 406 encodes the data prior to storing the data in the NVM 110. The plurality of hashes 404a-404n may generate a signature for the data, where the signature is stored in the respective bloom filter.

If a bit is a "1" in the bit array 408, the bit cannot be changed to a "0". When a "search" operation is requested, the "found" signal outputs a "1" if the data being searched for is saved in a buffer or the NVM 110. If the "found" signal outputs a "0", then the data being searched for is not saved in the buffer or the NVM 110. In certain examples, a false positive may possible as a "1" may be outputted even when the data is not located in the buffer or the NVM 110. However, the probability of outputting a false positive may be minimized by changing design parameters, according to the following formula: $P_{FP}=(1-e-KN/M)^K$, where N is the number of saved packets. It is to be understood that the bloom filter may be implemented for each of the decoding stages as well as the overall decoding operation. In some examples, the one or more bloom filters may be stored in RAM, such as SRAM or DRAM, and backed up in the NVM 110. In other examples, the one or more bloom filters may be also stored in a host memory buffer (HMB) of the DRAM of the host device 104.

Figure 5:
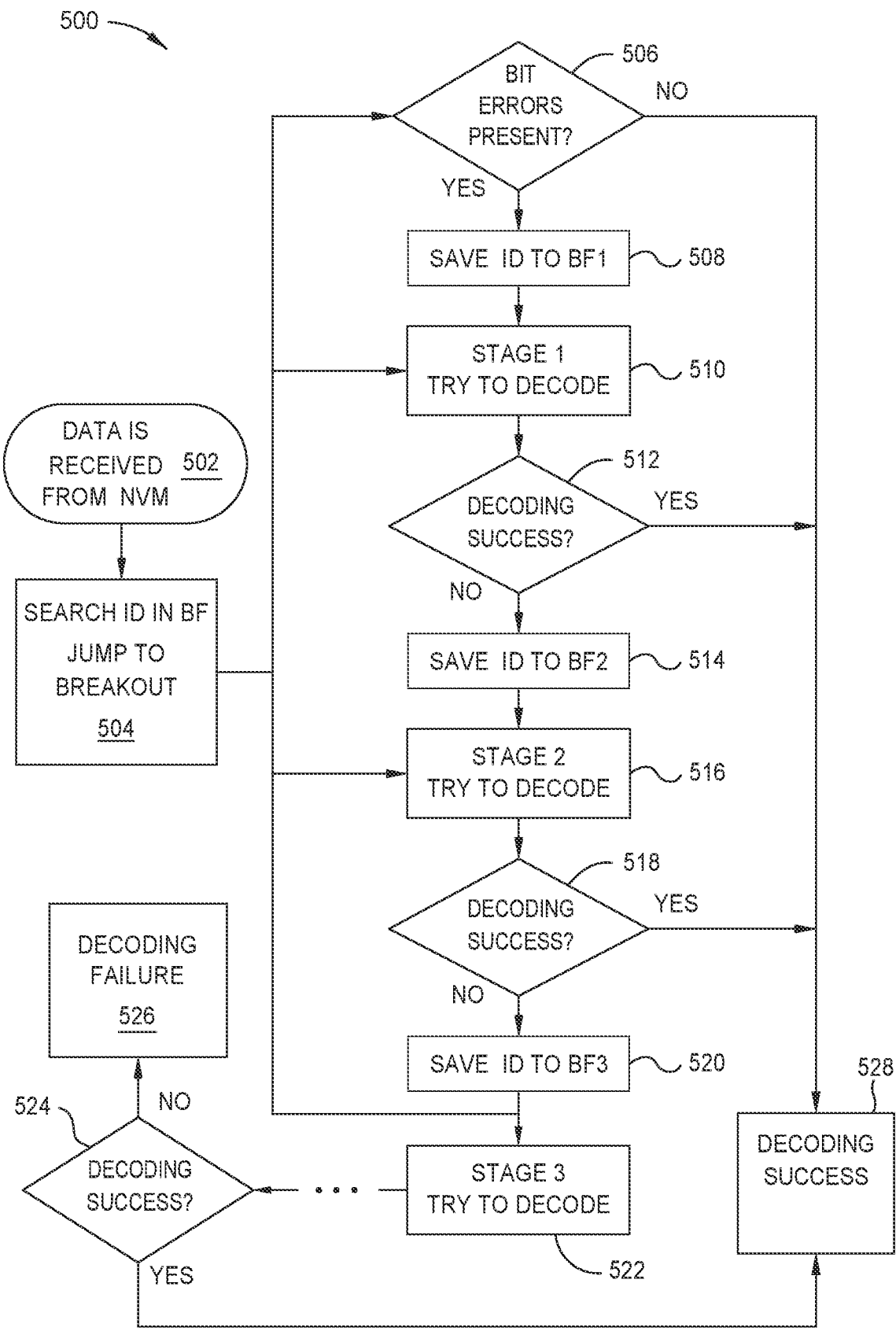
FIG. 5 is a flow diagram illustrating a method of using a bloom filter in a decoding operation, according to certain embodiments.

FIG. 5 is a flow diagram illustrating a method 500 of using a bloom filter in a decoding operation, according to certain embodiments. Aspects of the storage system 100 of FIG. 1 may be referenced herein for exemplary purposes. Method 500 may be implemented by the controller 108.

At block 502, the controller 108 receives data from the NVM 110. For example, the controller 108 may retrieve data from the NVM 110 in response to a read command received from the host device 104 or as part of a data management operation, such as garbage collection, of the data storage device 106. The data in the NVM 110 is stored as encoded data. At block 504, the controller 108 or the decoder searches for an ID or signature corresponding to the retrieved data, or in some examples, the block itself, in a general bloom filter, where the general bloom filter includes IDs or signatures for each of the decoder level bloom filters. The ID or signature may be the physical block address of the data, the data after compression, or any other compression mechanism that results in an almost unique result for the data, where there is a very high probability that other data has a different signature associated with the compression mechanism.

When the ID or signature for the received data or block is not is not found in any of the bloom filters, the controller 108 checks for bit errors at block 506. If there are no bit errors at block 506, then the controller 108 returns the decoded data to the host device with a completion message at block 528. However, if there are bit errors at block 506, then the controller 108 saves the ID or signature for the received data or block to a first bloom filter at block 508, where the first bloom filter corresponds to a stage 1 decoding pool of decoders, such as the plurality of tier 1 decoders 204a-204n of FIG. 2.

At block 510, the controller 108 attempts to decode the received data using a stage 1 decoding decoder. If the ID or the signature for the received data or block is located in the general bloom filter, where the ID or the signature corresponds to a stage 1 decoding decoder, at block 504, then he controller 108 may send the received data to a stage 1 decoding decoder without checking for bit errors at block 510. At block 512, the controller 108 determines if the decoding was successful. If the decoding was successful at block 512, then the controller 108 returns the decoded data to the host device with a completion message at block 528.

However, if the decoding was not successful at block 512, then the controller 108 saves the ID or signature for the received data or block to a second bloom filter at block 514, where the second bloom filter corresponds to a stage 2 decoding pool of decoders, such as the plurality of tier 2 decoders 206a-206n of FIG. 2. At block 516, the controller 108 attempts to decode the received data using a stage 2 decoding decoder. If the ID or the signature for the received data or block is located in the general bloom filter, where the ID or the signature corresponds to a stage 2 decoding decoder, at block 504, then the controller 108 may send the received data to a stage 2 decoding decoder without checking for bit errors at block 510. At block 518, the controller 108 determines if the decoding was successful. If the decoding was successful at block 518, then the controller 108 returns the decoded data to the host device with a completion message at block 528.

However, if the decoding was not successful at block 518, then the controller 108 saves the ID or signature for the received data or block to a third bloom filter at block 520, where the third bloom filter corresponds to a stage 3 decoding pool of decoders, such as the plurality of tier 3 decoders 208a-208n of FIG. 2. At block 522, the controller 108 attempts to decode the received data using a stage 3 decoding decoder. If the ID or the signature for the received data or block is located in the general bloom filter, where the ID or the signature corresponds to a stage 3 decoding decoder, at block 504, then the controller 108 may send the received data to a stage 3 decoding decoder without checking for bit errors at block 510. Method 500 iterates through decoding, saving, and checking if the decoding was successful until a limit is reached, such as a limit corresponding to a maximum strength of decoder, a timeout limit, and the like. At block 524, the controller 108 determines if the decoding was successful. If the decoding was not successful at block 524, then the controller 108 returns a failure indication to the host device at block 526. However, if the decoding was successful at block 524, then the controller 108 returns the decoded data to the host device with a completion message at block 528.

It is to be understood that the general bloom filter may be either updated each time a bloom filter associated with a decoding group (e.g., stage 1 decoding decoders, stage 2 decoding decoders, etc.) is updated, updated periodically, or a combination of the previously mentioned criteria. It is to be further understood that other criteria for updating the general bloom filter is contemplated and may be applicable to the described embodiments. Even if a false positive match occurs in the bloom filter, the decoding using a higher strength decoder may still be beneficial and may save overall decoding time. Thus, when the same data is being read more than once, the data storage device performance may be improved since the some of the decoding steps may be skipped (e.g., skipping lower tier decoders).

By storing incorporating one or more bloom filters storing which decoders were used for previously completed decoding operations for data stored in the memory device, the decoding time of the decoding operation may be improved, thus, improving quality of service provided by the data storage device.

In one embodiment, a data storage device includes a memory device and a controller coupled to the memory device. The controller is configured to decode data from the memory device, store a decoder level for the decoded data in a bloom filter, receive a read command for the data, and decode the data using a decoder associated with the stored decoder level.

The controller includes two or more groups of decoders. Each group of decoders includes one or more decoders. A first group of decoders is a first decoder tier and a second group of decoders is a second decoder tier. The first decoder tier has a lower decoding capability than the second decoder tier. The controller is further configured to determine that the decoding failed for a first decoder. The controller is further configured to decode the data using a second decoder. The second decoder has a higher decoding capability than the first decoder. The controller is further configured to decode the data using a third decoder upon determining that the second decoder has failed. The third decoder has a higher decoding capability than the second decoder. The controller is further configured to determine that the third decoder has successfully decoded the data and store an ID associated with the data in a different bloom filter. The controller is further configured to search an ID associated with the data in the bloom filter upon receiving the data from the memory device and determine the decoder level to decode the data based on the searching.

In another embodiment, a data storage device includes a memory device and a controller coupled to the memory device. The controller is configured to receive read data from the memory device, search one or more bloom filters for an ID associated with the read data, and decode the read data based on the ID, where the ID corresponds to a decoder level of a plurality of decoder levels.

The controller is further configured to save the ID in a first bloom filter, wherein the first bloom filter is associated with the first decoder level, determine a first decoding of the read data using a first decoder level has failed, and save the ID in a second bloom filter. The second bloom filter is associated with the second decoder level. The second decoder level has a higher decoding capability than the first decoder level. The controller is further configured to decode the read data using the second decoder level, determine a second decoding of the read data using the second decoder level has failed, and save the ID in a third bloom filter. The third bloom filter is associated with the third decoder level. The third decoder level has a higher decoding capability than the second decoder level. The controller is further configured to determine that a third decoding of the read data using the third decoder level has failed and return a decoding failure. The controller is further configured to decode the read data using the second decoder level, determine a second decoding of the read data using the second decoder level has succeeded, and return a decoding success. The plurality of decoder levels are each associated with a distinct low-density parity-check (LDPC) engine. The plurality of decoder levels includes a first decoder level, a second decoder level, and a third decoder level. The first decoder level has a slower decoding speed than the second decoder level. The second decoder level has a slower decoding speed than the third decoder level. The read data has been decoded previously.

In another embodiment, a data storage device includes memory means and a controller coupled to the memory means. The controller is configured to detect that received read data has been decoded previously, use a bloom filter to determine a decoder level that the received read data has been successfully decoded based on the detecting, and decode the received read data using the determined decoder level.

The controller includes a number of decoder levels and a number of bloom filters. The number of bloom filters is at least equal to the number of decoder levels. The determining the decoder level includes searching the bloom filter for an ID associated with the read data. The ID is a physical ID of the received read data, the received read data after compression, or an signature associated with the received read data. The bloom filter is stored in random access memory (RAM).

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
a memory device; and
a controller coupled to the memory device, the controller configured to:
  decode data from the memory device, wherein the decoding comprises:
    determining whether the decoding was successful; and
    passing the data to a decoder having a higher correction capability than a decoder used to decode the data until the data is successfully decoded;
  store a decoder level for the decoded data in a bloom filter, wherein the decoder level is based on a decoding strength previously used to successfully decode the data;
  receive a read command for the data; and
  decode the data using a decoder associated with the stored decoder level.

2. The data storage device of claim 1, wherein the controller comprises two or more groups of decoders, and wherein each group of decoders comprises one or more decoders.

3. The data storage device of claim 2, wherein a first group of decoders is a first decoder tier and a second group of decoders is a second decoder tier, wherein the first decoder tier has a lower decoding capability than the second decoder tier.

4. The data storage device of claim 1, wherein the controller is further configured to determine that the decoding failed for a first decoder.

5. The data storage device of claim 4, wherein the controller is further configured to decode the data using a second decoder, and wherein the second decoder has a higher decoding capability than the first decoder.

6. The data storage device of claim 5, wherein the controller is further configured to decode the data using a third decoder upon determining that the second decoder has failed, and wherein the third decoder has a higher decoding capability than the second decoder.

7. The data storage device of claim 6, wherein the controller is further configured to:
  determine that the third decoder has successfully decoded the data; and
store an ID associated with the data in a different bloom filter.

8. The data storage device of claim 1, wherein the controller is further configured to:
  search an ID associated with the data in the bloom filter upon receiving the data from the memory device; and
  determine the decoder level to decode the data based on the searching.

9. A data storage device, comprising:
a memory device; and
a controller coupled to the memory device, the controller configured to:
  receive read data from the memory device;
  search one or more bloom filters for an ID associated with the read data; and
  decode the read data based on the ID, wherein the ID corresponds to a decoder level of a plurality of decoder levels, wherein the decoder level is based on a decoding strength previously used to successfully decode the read data, wherein the decoding comprises:
    determining whether the decoding was successful; and
    passing the data to a decoder having a higher correction capability than a decoder used to decode the data until the data is successfully decoded.

10. The data storage device of claim 9, wherein the controller is further configured to:
  save the ID in a first bloom filter, wherein the first bloom filter is associated with a first decoder level;
  determine a first decoding of the read data using the first decoder level has failed; and
  save the ID in a second bloom filter, wherein the second bloom filter is associated with a second decoder level, and wherein the second decoder level has a higher decoding capability than the first decoder level.

11. The data storage of claim 10, wherein the controller is further configured to:
  decode the read data using the second decoder level;
  determine a second decoding of the read data using the second decoder level has failed; and
  save the ID in a third bloom filter, wherein the third bloom filter is associated with a third decoder level, and wherein the third decoder level has a higher decoding capability than the second decoder level.

12. The data storage device of claim 11, wherein the controller is further configured to:
  determine that a third decoding of the read data using the third decoder level has failed; and
  return a decoding failure.

13. The data storage device of claim 10, wherein the controller is further configured to:
  decode the read data using the second decoder level;
  determine a second decoding of the read data using the second decoder level has succeeded; and
  return a decoding success.

14. The data storage device of claim 9, wherein the plurality of decoder levels are each associated with a distinct low-density parity-check (LDPC) engine.

15. The data storage device of claim 9, wherein the plurality of decoder levels comprises a first decoder level, a second decoder level, and a third decoder level, wherein the first decoder level has a slower decoding speed than the second decoder level, and wherein the second decoder level has a slower decoding speed than the third decoder level.

16. The data storage device of claim 9, wherein the read data has been decoded previously.

* * * * *